(12) United States Patent
Wang et al.

(10) Patent No.: US 10,386,022 B2
(45) Date of Patent: Aug. 20, 2019

(54) LIGHT-EMITTING DEVICE AND METHOD FOR MANUFACTURING THE LIGHT-EMITTING DEVICE

(71) Applicant: OSRAM GmbH, Munich (DE)

(72) Inventors: Zuzhi Wang, Shenzhen (CN); Yabin Luo, Shenzhen (CN); Canbang Yang, Shenzhen (CN)

(73) Assignee: OSRAM GMBH, Munich (DE)

( * ) Notice: Subject to any disclaimer, the term of this patent is extended or adjusted under 35 U.S.C. 154(b) by 0 days.

(21) Appl. No.: 15/319,411

(22) PCT Filed: Apr. 29, 2015

(86) PCT No.: PCT/EP2015/059360
§ 371 (c)(1),
(2) Date: Dec. 16, 2016

(87) PCT Pub. No.: WO2015/193015
PCT Pub. Date: Dec. 23, 2015

(65) Prior Publication Data
US 2017/0159893 A1 Jun. 8, 2017

(30) Foreign Application Priority Data

Jun. 18, 2014 (CN) .......................... 2014 1 0274034

(51) Int. Cl.
*F21S 4/24* (2016.01)
*F21V 15/01* (2006.01)
(Continued)

(52) U.S. Cl.
CPC .............. *F21K 9/272* (2016.08); *F21K 9/275* (2016.08); *F21K 9/90* (2013.01); *F21S 4/22* (2016.01);
(Continued)

(58) Field of Classification Search
CPC .. F21K 9/272; F21K 9/275; F21K 9/90; F21S 4/24; F21S 4/22; F21S 4/26;
(Continued)

(56) References Cited

U.S. PATENT DOCUMENTS 7,273,300 B2 * 9/2007 Mrakovich ............ G02B 6/001
362/235
8,388,182 B2 * 3/2013 Chang ................. F21V 19/0015
362/249.02
(Continued)

FOREIGN PATENT DOCUMENTS

CN 202791420 U 3/2013
CN 103206617 A 7/2013
(Continued)

OTHER PUBLICATIONS

International Search Report based on application No. PCT/EP2015/059360 (7 pages) dated Dec. 11, 2015.
(Continued)

*Primary Examiner* — Alan B Cariaso
(74) *Attorney, Agent, or Firm* — Viering Jentschura & Partner MBB

(57) ABSTRACT

Various embodiments may relate to a light-emitting device. The light-emitting device includes an encapsulation housing and a light engine arranged in the encapsulation housing. The light engine is arranged in the encapsulation housing in such a manner that a cavity is formed between the light engine and the encapsulation housing. At least the exit surface of a light source arranged on one side of the light engine is located in the cavity.

18 Claims, 1 Drawing Sheet

(51) Int. Cl.

| | | |
|---|---|---|
| *F21V 31/04* | (2006.01) | |
| *H01L 33/54* | (2010.01) | |
| *H01L 33/62* | (2010.01) | |
| *F21K 9/272* | (2016.01) | |
| *F21V 31/00* | (2006.01) | |
| *F21K 9/90* | (2016.01) | |
| *F21S 4/22* | (2016.01) | |
| *F21K 9/275* | (2016.01) | |
| *F21V 15/015* | (2006.01) | |
| *F21W 131/10* | (2006.01) | |
| *F21Y 103/10* | (2016.01) | |
| *F21Y 115/10* | (2016.01) | |

(52) U.S. Cl.
CPC .............. *F21S 4/24* (2016.01); *F21V 15/012* (2013.01); *F21V 15/015* (2013.01); *F21V 31/005* (2013.01); *H01L 33/54* (2013.01); *H01L 33/62* (2013.01); *F21V 31/00* (2013.01); *F21V 31/04* (2013.01); *F21W 2131/10* (2013.01); *F21Y 2103/10* (2016.08); *F21Y 2115/10* (2016.08); *H01L 2933/005* (2013.01)

(58) Field of Classification Search
CPC .... F21V 15/012; F21V 15/015; F21V 31/005; F21V 31/00; F21V 31/04; H01L 2933/005; H01L 33/52; H01L 33/54; F21W 2131/10

See application file for complete search history.

(56) References Cited

U.S. PATENT DOCUMENTS

| | | | | |
|---|---|---|---|---|
| 8,459,834 | B2 * | 6/2013 | Chang ........................ | F21S 4/28 362/219 |
| 9,695,991 | B2 * | 7/2017 | Camarota ................ | F21K 9/27 |
| 2002/0174995 | A1 * | 11/2002 | Southard ................... | G09F 9/33 174/481 |
| 2005/0036310 | A1 * | 2/2005 | Fan ......................... | G09F 13/22 362/240 |
| 2007/0087619 | A1 * | 4/2007 | Nall ....................... | F21V 21/002 439/417 |
| 2007/0211458 | A1 * | 9/2007 | Bertram ................... | B60Q 3/43 362/227 |
| 2011/0096545 | A1 | 4/2011 | Chang | |
| 2011/0188248 | A1 | 8/2011 | Chang | |
| 2012/0113633 | A1 | 5/2012 | Bowen | |
| 2013/0293098 | A1 * | 11/2013 | Li ............................. | F21V 3/02 313/512 |
| 2014/0036500 | A1 | 2/2014 | Eggleton | |
| 2014/0043803 | A1 * | 2/2014 | Kawashima ............ | F21V 21/00 362/231 |
| 2014/0104828 | A1 * | 4/2014 | Wei ..................... | F21V 19/0045 362/223 |
| 2014/0119024 | A1 * | 5/2014 | Yu ............................. | F21S 6/00 362/294 |
| 2015/0049474 | A1 * | 2/2015 | Pan ........................ | F21K 9/175 362/218 |

FOREIGN PATENT DOCUMENTS

| | | |
|---|---|---|
| CN | 103597272 A | 2/2014 |
| DE | 202009002127 U1 | 6/2009 |
| WO | 2013104554 A1 | 7/2013 |

OTHER PUBLICATIONS

Chinese Office Action including Search Report issued for Chinese counterpart application No. 201410274034.X, dated Jun. 25, 2018, 5 pages and 5 pages translation (for reference purpose only).

* cited by examiner

LIGHT-EMITTING DEVICE AND METHOD FOR MANUFACTURING THE LIGHT-EMITTING DEVICE

RELATED APPLICATIONS

The present application is a national stage entry according to 35 U.S.C. § 371 of PCT application No.: PCT/EP2015/059360 filed on Apr. 29, 2015, which claims priority from Chinese application No.: 201410274034.X filed on Jun. 18, 2014, and is incorporated herein by reference in its entirety.

TECHNICAL FIELD

Various embodiments relate to a light-emitting device and a method for manufacturing the light-emitting device.

BACKGROUND

The LED technology is commonly applied in the illumination field. This technology has the advantages such as high efficiency and energy saving, and especially the flexible lighting strip using the LED technology not only has the advantages of the LED technology but also can be applied to various outdoor circumstances utilizing its characteristics such as flexibility and sealing performance. The conventional LED flexible lighting strip achieves full-sealing of the light source and achieves the waterproof and dustproof effects, but owing to the design limitation thereof, the requirements of the users to the color temperature of the light of the lighting strip cannot be met. Users usually expect that the light of the lighting strip can have warm white color temperature, but the existing flexible lighting strip generally directly encapsulates the light source completely with flexible material, and the encapsulation material is closely in contact with the light source. The color temperature of such type of product often only has a color temperature biased to cold light due to the encapsulation result, and a sealed lighting strip with a warm color temperature cannot be achieved. Besides, apart from a cold color temperature, such conventional lighting strip does not have a lumen output high enough and cannot achieve sufficient illumination strength.

SUMMARY

Various embodiments provide a novel light-emitting device, especially an LED flexible lighting strip. This device, using its special structural design, not only can have a low cost of product, but also can enable the light-emitting device to have the illumination effect of warm color temperature on the basis of providing full-sealing waterproof and dustproof functions. Besides, the lighting device has a high lumen output, and is capable of achieving high enough illumination strength.

The first object of the present disclosure is accomplished via such a light-emitting device that includes an encapsulation housing and a light engine arranged in the encapsulation housing, wherein the light engine is arranged in the encapsulation housing in such a manner that a cavity is formed between the light engine and the encapsulation housing, wherein at least the exit surface of a light source arranged on one side of the light engine is located in the cavity. According to the solution of the present disclosure, a cavity or preferably an air layer is configured between the light source and the encapsulation housing, when at least the exit surface of the light source is arranged in the cavity, light from the light source will not directly enter the material of the encapsulation housing, but firstly enter the cavity between the light source and the encapsulation housing, then enter the encapsulation housing, and exit through the encapsulation housing. In this way, the material of the encapsulation housing at least will not directly be in contact with the surface of the light source, providing the possibility of reducing the influence of the material of the encapsulation housing on the color temperature of the light source. Besides, compared with a light-emitting device in which an encapsulation material directly fully encapsulates a light engine and no cavity of the present disclosure is present, the light-emitting device of the present disclosure can enable the light eventually to exit through the encapsulation material and have a warm color temperature, instead of a rather cold color temperature.

According to one example of the present disclosure, the encapsulation housing includes a first housing portion and a second housing portion, wherein the first housing portion includes a receiving groove for receiving the second housing portion, the receiving groove is separated from the cavity by the light engine, and the other side of the light engine opposite to the side arranged with the light source is closed by the second housing portion. With the second housing portion, the light engine can be encapsulated on the back of the light engine, i.e., on the side opposite to the light source, which results in that the first housing portion and the second housing portion have the possibility of being capable of fully sealing the light engine, and achieving the waterproof and dustproof effects of the light engine.

Preferably, the light-emitting device has a strip-shape, and the first housing portion, the second housing portion and the light engine extend along a longitudinal direction of the light-emitting device.

Preferably, the encapsulation housing further includes end caps at its two ends, the end caps are connected to the first housing portion and the second housing portion, in a form-fitted manner. The end caps can be used as electrical connectors of the light engine. By arranging and connecting the end caps to both ends of the light engine, the end caps not only can supply electrical energy to the light engine, but also can provide full-sealing of the light engine at said both ends, so as to eventually achieve the waterproof and dustproof effects of the light engine.

Advantageously, the end caps are connected to the first housing portion and the second housing portion in a binding manner. In a simple and low-cost binding manner, the end caps can be connected to the first housing portion and the second housing portion, and finally seal the light engine in the encapsulation housing to achieve the waterproof and dustproof effects of the light engine.

According to a preferred example of the present disclosure, the receiving groove and the cavity are integrally formed in the first housing portion. The cavity and the receiving groove can be formed together in the first housing portion through a simple process, achieving the possibility of simplifying the manufacture of the light-emitting device.

Preferably, the first housing portion and the second housing portion are made from flexible material. With the flexible material, a flexible lighting strip, for instance, can be made, such that the manufactured light-emitting device can have the characteristic of flexibility, which not only achieves full-sealing of the light engine in the lighting strip and results in the waterproof effect, but also achieves application of this lighting strip in various circumstances.

Preferably, the first housing portion is made from silica gel or PU glue and the second housing portion is made from silica gel or PU glue. According to this solution, the first housing portion and the second housing portion for manufacturing the light-emitting device can be made simply at a low cost, and the light engine in the receiving groove is fully sealed in a situation where the first housing portion is already formed with the receiving groove and the flexibility of the lighting strip is not affected.

Advantageously for the present disclosure, the receiving groove further includes a side groove formed in a side wall of the first housing portion defining the receiving groove, the side groove extend in the longitudinal direction of light-emitting device. In order to improve the operating stability and reliability of the light-emitting device of the present disclosure, the side grooves can be configured in the first housing portion. The side grooves can block the material for forming the second housing portion, and prevent this material from entering the cavity during the process of manufacturing the light-emitting device or during the operation of the light-emitting device.

Preferably, the light engine includes a flexible circuit board. The flexible circuit board forms a flexible lighting strip with the flexible first housing portion and second housing portion, such that this lighting strip can be used in various circumstances where an illumination device needs to be flexible.

Preferably, the light-emitting device is a flexible LED lighting strip. The flexible LED lighting strip according to the present disclosure not only has good flexibility due to its material and structure design, but also realizes the waterproof and dustproof effects of the light engine as the light engine in the lighting strip can be well sealed, moreover, the exiting light of this flexible lighting strip has a warm color temperature and good illumination effect.

Another object of the present disclosure is accomplished via a method for manufacturing a light-emitting device, the method including: a) providing a first housing portion within which a receiving groove and a cavity are formed in a connection manner; b) arranging a light engine between the cavity and the receiving groove in a manner that one side of the light engine provided with a light source faces the cavity, and the other side of the light engine faces the receiving groove, wherein at least the exit surface of the light source is located in the cavity; and c) filling the receiving groove with an encapsulation material to form a second housing portion. According to the method of the present disclosure, a light-emitting device of the type of flexible lighting strip can be simply manufactured at a low cost, such that the exiting light of this type of light-emitting device has a warm color temperature, instead of a rather cold color temperature as provided by a conventional lighting strip.

According to the method for manufacture the light-emitting device of the present disclosure, preferably, the first housing portion is made from silica gel or PU glue through an extrusion process and the second housing portion is made from silica gel or PU glue through a potting process. The silica gel or PU glue after molding has good flexibility, sealing performance, and insulation, and this material is simply processed at a low cost, resulting in easy processing and manufacturing of the light-emitting device.

Preferably, the step a) further includes forming a side groove in a side wall of the first housing portion defining the receiving groove so as to receive an overflow of encapsulation material. The grooves are formed simply at a low cost, moreover, the side grooves also provide good and reliable operating performances of the light-emitting device, and prevent the material forming the second housing portion from entering the cavity and affecting the illumination performances of the lighting strip during the manufacture of the light-emitting device or during usage of the light-emitting device.

Preferably, the step c) further includes providing end caps at two ends of the light-emitting device, wherein the end caps are connected to the first housing portion and the second housing portion in a binding manner. The end caps can serve a function of electrical connection for the lighting strip, and also can achieve final full-sealing effect for the lighting strip through a simple processing and manufacturing process.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

In the following detailed description, reference is made to the accompanying drawings, which form a part hereof, and in which is shown by way of illustration specific embodiments in which the disclosure may be practiced. In this regard, directional terminology, such as "upper", "lower", "left", "right", is used in reference to the orientation of the figures being described. Because components of embodiments of the present disclosure can be positioned in a number of different orientations, the directional terminology is used for purposes of illustration and is in no way limiting. It is to be understood that other embodiments may be utilized and structural or logical changes may made without departing from the scope of the present disclosure. The following detailed description, therefore, is not to be taken in a limiting sense, and the scope of the present disclosure is defined by the appended claims.

Figure 1:
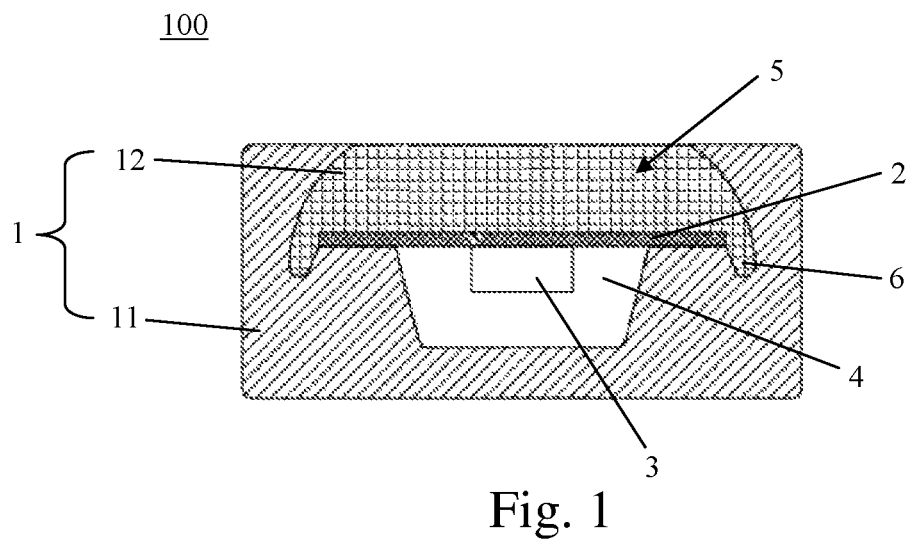
FIG. 1 shows a cross-section schematic diagram of a light-emitting device according to an embodiment of the present disclosure.

FIG. 1 shows a cross-section schematic diagram of a light-emitting device 100 according to an embodiment of the present disclosure. This light-emitting device 100 includes an encapsulation housing 1 and a light engine 2 provided in the encapsulation housing 1. The encapsulation housing 1 may be divided into a first housing portion 11 and a second housing portion 12 according to the process of manufacturing this light-emitting device 100 or relative positions to a light source 3 of the light engine 2. A receiving groove 5 is formed in the first housing portion 11. When the light engine 2 is arranged in the receiving groove 5, the light engine 2 can divide the receiving groove 5 into two portions, upper and lower portions, as shown in FIG. 1. A space of the lower portion, where the light source 3 is located, formed by the light engine 2 and the receiving groove 5 is formed into a cavity 4 which provides the space for receiving the light source 3 and supplies a gap or air layer at least between an exit surface of the light source 3 and the first housing portion 11.

In addition, on the side opposite to the light source 3, i.e., on back of the light engine 2, a space of the upper portion formed by the light engine 2 and the receiving groove 5 is used for forming the second housing portion 12. Herein, the light engine 2 can be preferably configured as a flexible circuit board, the light source can be preferably an LED, and then, with the first housing portion 11 and the second housing portion 12, the light engine 2 can be sealed in the encapsulation housing 1. In order to manufacture the final flexible lighting strip, the material for forming the first housing portion 11 and the second housing portion 12 can be preferably silica gel or PU glue, or other similar materials having good flexibility, waterproofness, and insulation. The flexible lighting strip made from the above materials can achieve good sealing of the light engine 2 and the effects such as waterproofness and dustproofness. More specifically, when the first housing portion 11 and the second housing portion 12 are being manufactured, the first housing portion 11 can be preferably made from a silica gel or a PU glue through an extrusion process, and after the flexible circuit board as the light engine 2 is arranged in the receiving groove 5 of the first housing portion 11, the silica gel or the PU glue is potted to the side opposite to the light source 3, i.e., the back of the flexible circuit board, so as to form the second housing portion 12 after the material is molded.

In the process of, for instance, manufacturing the light-emitting device or using the light-emitting device, in order to prevent the material for forming the second housing portion 12 from entering the cavity 4 and affecting the normal use of the lighting strip and the normal function of the cavity, as also can be seen from FIG. 1, side grooves 6 are further configured in the first housing portion 11. The side grooves 6 are specifically for instance preferably configured at two sides, left and right sides, of the light engine 2 as shown in the cross-section diagram of FIG. 1, and extend along a longitudinal direction of the light engine 2.

Figure 2:
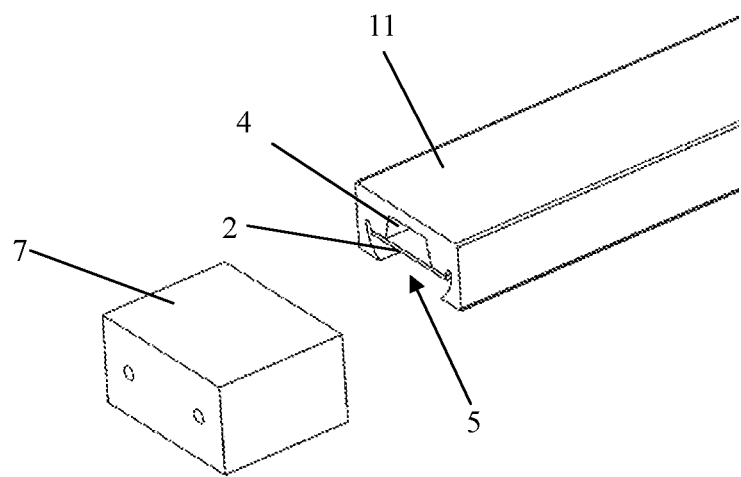
FIG. 2 shows a side view of the light-emitting device according to an embodiment of the present disclosure.

FIG. 2 shows a side view of the light-emitting device 100 according to an embodiment of the present disclosure. In a preferred embodiment, on the basis of the contents already described in FIG. 1, end caps 7 can be further provided. The end caps 7 can be configured as electrical connectors used for the light engine 2. Besides, the end caps 7 can be connected with both ends of the light engine 2, for instance, in a form-fitted manner, by simple binding, using glue etc., such that electrical connection is finally formed between the end caps 7 and the light engine 2, and mechanical or similar physical connection is formed between the end caps 7 and the encapsulation housing. After the end caps 7 are connected with the encapsulation housing, the end caps 7 can form full-sealing of the light engine 2 with the encapsulation housing so as to achieve the effects such as waterproofness and dustproofness of the light engine 2.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A light-emitting device, comprising:
an encapsulation housing and
a light engine arranged in the encapsulation housing comprising a first side and a second side opposite to the first side,
wherein the light engine is arranged in the encapsulation housing in such a manner that a cavity is formed between the light engine and the encapsulation housing,
wherein at least an exit surface of a light source arranged on the first side of the light engine is located in the cavity; and
wherein the encapsulation housing comprises a first housing portion and a second housing portion, wherein the first housing portion comprises a receiving groove for receiving the second housing portion, the second housing portion is separated from the cavity by the light engine, and the second side of the light engine is enclosed by the second housing portion.

2. The light-emitting device according to claim 1, wherein the light-emitting device has a strip-shape, the first housing portion, the second housing portion, and the light engine extend along a longitudinal direction of the light-emitting device.

3. The light-emitting device according to claim 2, wherein the encapsulation housing further comprises end caps at its two ends, the end caps are connected to the first housing portion and the second housing portion, in a form-fitted manner.

4. The light-emitting device according to claim 3, wherein the end caps are connected to the first housing portion and the second housing portion in a binding manner.

5. The light-emitting device according to claim 2, wherein the first housing portion and the second housing portion are made from flexible material.

6. The light-emitting device according to claim 5, wherein the first housing portion is made from silica gel or PU glue and the second housing portion is made from silica gel or PU glue.

7. The light-emitting device according to claim 6, wherein the receiving groove further comprises a side groove formed in a side wall of the first housing portion defining the receiving groove, the side groove extends in the longitudinal direction of light-emitting device.

8. The light-emitting device according to claim 1, wherein the receiving groove and the cavity are integrally formed in the first housing portion.

9. The light-emitting device according to claim 1, wherein the light engine comprises a flexible circuit board.

10. The light-emitting device according to claim 1, wherein the light-emitting device is a flexible LED lighting strip.

11. The light-emitting device according to claim 1, wherein the cavity is an air layer.

12. The light-emitting device according to claim 1, wherein the receiving groove forms the second housing portion.

13. A method for manufacturing a light-emitting device, the method comprising:
a) providing a first housing portion within which a receiving groove and a cavity are formed in a connection manner;
b) arranging a light engine between the cavity and the receiving groove in a manner that a first side of the light engine provided with a light source faces the cavity, and a second side of the light engine faces the receiving groove, wherein at least an exit surface of the light source is located in the cavity and wherein the second side of the light engine is opposite to the first side of the light engine; and c) filling the receiving groove with encapsulation material to form a second housing portion; enclosing the second side of the light engine with the light source by the second housing;

wherein the light engine separates the cavity from the second housing portion.

14. The method according to claim 13, wherein the first housing portion is made from silica gel or PU glue through an extrusion process and the second housing portion is made from silica gel or PU glue through a potting process.

15. The method according to claim 14, wherein a) further comprises forming a side groove in a side wall of the first housing portion defining the receiving groove, so as to receive an overflow of encapsulation material.

16. The method according to claim 13, wherein c) further comprises providing end caps at two ends of the light-emitting device, wherein the end caps are connected to the first housing portion and the second housing portion in a binding manner.

17. A light-emitting device, comprising:
an encapsulation housing and
a light engine arranged in the encapsulation housing comprising a first side and a second side opposite to the first side,
wherein the light engine is arranged in the encapsulation housing in such a manner that a cavity is formed between the light engine and the encapsulation housing,
wherein at least an exit surface of a light source arranged on the first side of the light engine is located in the cavity;
wherein the encapsulation housing comprises a first housing portion and a second housing portion, wherein the first housing portion comprises a receiving groove for forming the second housing portion, the second housing portion is separated from the cavity by the light engine, and a second side of the light engine is enclosed by the second housing portion;
wherein the light-emitting device has a strip-shape, the first housing portion, the second housing portion, and the light engine extend along a longitudinal direction of the light-emitting device;
wherein the first housing portion and the second housing portion are made from flexible material;
wherein the first housing portion is made from silica gel or PU glue and the second housing portion is made from silica gel or PU glue.

18. The light emitting device according to claim 17, wherein the receiving groove further comprises a side groove formed in a side wall of the first housing portion defining the receiving groove, the side groove extends in the longitudinal direction of light-emitting device.

* * * * *